United States Patent
Lai et al.

(10) Patent No.: US 6,670,656 B1
(45) Date of Patent: Dec. 30, 2003

(54) CURRENT-AMPLIFYING LOGARITHMIC MODE CMOS IMAGE SENSOR

(75) Inventors: Liang-Wei Lai, Banchiau (TW); Ya-Chin King, Chungli (TW)

(73) Assignee: Twin Han Technology Co., Ltd., Taipei (TW)

( * ) Notice: Subject to any disclaimer, the term of this patent is extended or adjusted under 35 U.S.C. 154(b) by 0 days.

(21) Appl. No.: 10/217,350

(22) Filed: Aug. 8, 2002

(30) Foreign Application Priority Data

Jun. 20, 2002 (TW) .................................... 91113450 A

(51) Int. Cl.[7] ............................................. H01L 27/148
(52) U.S. Cl. ..................... 257/223; 257/149; 257/230; 257/292
(58) Field of Search .............................. 257/149, 223, 257/230, 292, 431, 511

(56) References Cited

U.S. PATENT DOCUMENTS

| | | | | |
|---|---|---|---|---|
| 5,053,992 A | * | 10/1991 | Gilberg et al. | 365/185.04 |
| 5,235,197 A | * | 8/1993 | Chamberlain et al. | 257/230 |
| 5,461,425 A | * | 10/1995 | Fowler et al. | 348/294 |
| 5,900,623 A | * | 5/1999 | Tsang et al. | 250/208.1 |
| 6,355,965 B1 | | 3/2002 | He et al. | |
| 2002/0117682 A1 | * | 8/2002 | Vande Voorde et al. | 257/149 |
| 2003/0016084 A1 | * | 1/2003 | Scott et al. | 330/308 |

OTHER PUBLICATIONS

"CMOS Active Pixel Image Sensor with Combined Linear and Logarithmic Mode Operation" N. Tu, R.Hornsey, S.G. Ingram / Department of Electrical Engineering, University of Waterloo, On, / 1998 IEEE/ p. 754–757.

"A Self–Calibrating Single–Chip CMOS Camera with Logarithmic Response" Markus Loose, Karlheinz Meier, and Johannes Schemmel / IEEE Journal of Solid–State Circuits, vol. 36, No. 4, Apr. 2001 / p. 586–596.

"A Logarithmic Response CMOS Image Sensor with On–Chip Calibration" Spyros Kavadias et al. / IEEE Journal of Solid–State Circuits, vol. 35, No. 8, Aug. 2000 / p. 1146–1152.

\* cited by examiner

Primary Examiner—Hoai Ho
Assistant Examiner—Dao H. Nguyen
(74) Attorney, Agent, or Firm—J.C. Patents

(57) ABSTRACT

A current-amplifying logarithmic mode CMOS image sensor having a first MOS transistor, a second MOS transistor, a third MOS transistor and a sensing device. The gate terminal and the first connection terminal of the first MOS transistor are tied to a high voltage terminal. The gate terminal of the second MOS transistor and the second connection terminal of the first MOS transistor are tied to a node point. The first connection terminal of the second MOS transistor is tied to the high voltage terminal. The gate terminal of the third MOS transistor is tied to a row select signal. The first connection terminal of the third MOS transistor is tied to the second connection terminal of the second MOS transistor. The second terminal of the third MOS transistor serves as a voltage output terminal. The sensing device includes a PMOS transistor and a lateral bipolar junction transistor. The first connection terminal of the PMOS transistor is connected to the node and the second connection terminal of the PMOS transistor is connected to a grounded terminal. The gate terminal of the PMOS transistor is tied to a terminal for receiving a voltage control signal. The emitter terminal of the lateral PNP bipolar junction transistor is connected to the node point and the collector terminal of the lateral PNP bipolar junction transistor is connected to the ground terminal. The base terminal of the lateral PNP bipolar junction transistor remains in a floating state.

4 Claims, 10 Drawing Sheets

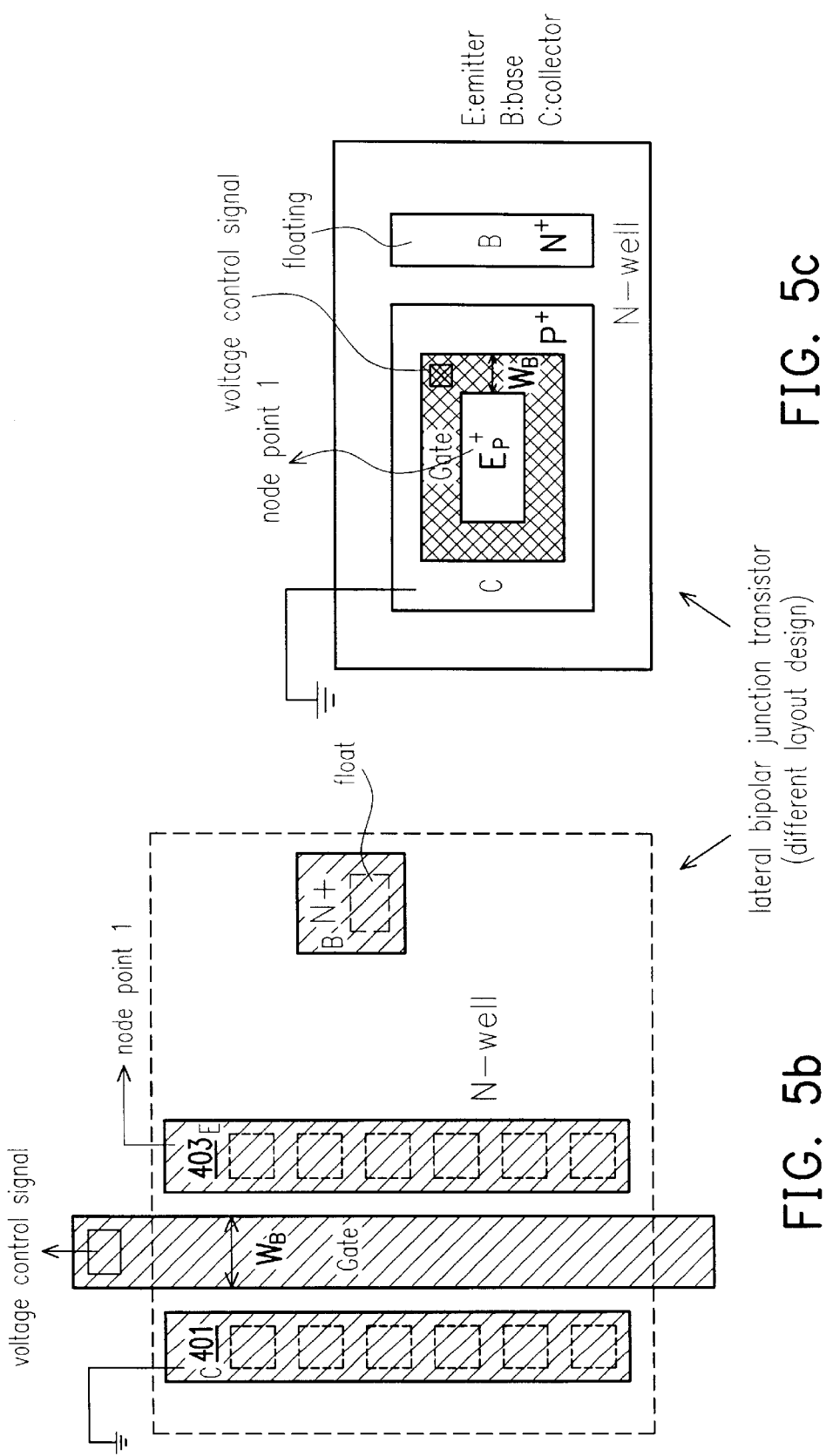

CURRENT-AMPLIFYING LOGARITHMIC MODE CMOS IMAGE SENSOR

CROSS-REFERENCE TO RELATED APPLICATION

This application claims the priority benefit of Taiwan application serial no. 91113450, filed Jun. 20, 2002.

BACKGROUND OF THE INVENTION

1. Field of Invention

The present invention relates to a current-amplifying logarithmic mode CMOS image sensor. More particularly, the present invention relates to a current-amplifying logarithmic mode CMOS image sensor having a lateral bipolar transistor structure.

2. Description of Related Art

In recent years, CMOS image sensors have been widely used in closed-circuit monitor systems, video communicators, digital cameras, fingerprint identification systems and so on. Some of the reasons for the popularity of CMOS image sensors include a low operation voltage and minimal power consumption. Moreover, CMOS circuits can be easily integrated (that is, control logic, logic/digital conversion circuit can be fabricated on a single chip), random accessed and fabricated by using conventional CMOS manufacturing techniques.

A current-amplifying logarithmic mode CMOS image sensor is one type of CMOS image sensor. FIG. 1 is the schematic circuit diagram of a conventional logarithmic mode CMOS image sensor. As shown in FIG. 1, the logarithmic mode CMOS image sensor mainly includes three NMOS transistors 101, 103, 105 and a photodiode 107. The gate of the NMOS transistor 101 is tied to a terminal connecting the highest voltage $V_{dd}$ in the circuit. The voltage between the gate terminal and source terminal of the NMOS transistor 101 has a logarithmic relationship with the current flowing from the drain terminal of the NMOS transistor 101. Hence, the output voltage $V_{out}$ and the intensity of light illuminating on the photodiode 107 also have a logarithmic relationship. Consequently, the conventional logarithmic mode CMOS image sensor has very wide dynamic range.

Although a conventional logarithmic mode CMOS image sensor has very high sensitivity and switches fast, the photo current flowing through the NMOS transistor 101 is too small when the photodiode 107 is illuminated by light within an ordinary range. This often leads to the output voltage $V_{out}$ of the conventional logarithmic mode CMOS image sensor being limited to a very small voltage range (between 0.2V~0.5V). Hence, analog/digital conversion circuits in a subsequent stage can hardly analyze the output voltage $V_{out}$ submitted from the conventional logarithmic mode CMOS image sensor. (Because the range of the output voltage provided by the conventional logarithmic mode CMOS image sensor is less than 1V, an 8-bit analog/digital converter needs to distinguish a voltage step as small as 1/256~0.004V.)

SUMMARY OF THE INVENTION

Accordingly, one object of the present invention is to provide a logarithmic mode CMOS image sensor using a lateral bipolar junction structure instead of photodiode for increasing voltage range at the voltage output terminal so that an analog/digital conversion circuit at a subsequent stage is easier to implement. The new design is called current-amplifying logarithmic mode CMOS image sensor.

To achieve these and other advantages and in accordance with the purpose of the invention, as embodied and broadly described, the invention provides a current-amplifying logarithmic mode CMOS image sensor. The CMOS image sensor includes a first MOS transistor, a second MOS transistor, a third MOS transistor and a sensor. The first MOS transistor has a gate terminal, a first connection terminal and a second connection terminal. The gate terminal and the first connection terminal of the first MOS transistor are tied to the highest voltage terminal. The second MOS transistor has a gate terminal, a first connection terminal and a second connection terminal. The gate terminal of the second MOS transistor and the second connection terminal of the first MOS transistor are tied to a node point. The first connection terminal of the second MOS transistor is tied to the highest voltage terminal. The third MOS transistor also has a gate terminal, a first connection terminal and a second connection terminal. The gate terminal of the third MOS transistor is tied to a row select signal. The first connection terminal of the third MOS transistor is tied to the second connection terminal of the second MOS transistor. In addition, the second terminal of the third MOS transistor serves as a voltage output terminal. $I_{bias}$ is the column amplifier bias current. $I_{bias}$ has the first and terminal. The first terminal of $I_{bias}$ is connected to the second terminal of the third MOS. The sensor includes a PMOS transistor and a lateral bipolar junction transistor. The PMOS transistor has a gate terminal, a first connection terminal and a second connection terminal. The first connection terminal of the PMOS transistor is connected to the node point and the second connection terminal of the PMOS transistor is connected to a ground terminal. The gate terminal of the PMOS transistor is tied to a terminal for receiving a voltage control signal. The emitter terminal of the lateral PNP bipolar junction transistor is connected to the node point and the collector terminal of the lateral PNP bipolar junction transistor is connected to the ground terminal. The base terminal of the lateral PNP bipolar junction transistor remains in a floating state.

This invention also provides a sensing device for a current-amplifying logarithmic mode CMOS image sensor. The sensing device comprises a substrate, a well, a first injection region, a second injection region, a third injection region, and a gate. The well doped with dopants that have different conductive type from the substrate is embedded within the substrate. The first injection region includes a connection terminal having ionic dopants that differ from the well. The first injection region is embedded within the well. The connection terminal is connected to a ground terminal. The second injection region includes a connection terminal having ionic dopants identical to the first injection region. The second injection region is embedded within the well, separated from but adjacent to the first injection region. The connection terminal of the second injection region is tied to the source/drain connection terminal of a load transistor, that is, the first MOS transistor within the current-amplifying logarithmic mode CMOS image sensor. The third injection region contains ionic dopants identical to the one within the well. The third injection region is embedded within the well, separated from but adjacent to the first and the second injection region. The gate is formed in the region above the space between the first injection region and the second injection region. The gate controls junction conductance between the first injection region, the well and the second injection region Note that adjusting width/length ratio of the load transistor (the first MOS transistor) can provide a large voltage output range to the current-amplifying logarithmic mode CMOS image sensor.

In brief, the current-amplifying logarithmic mode CMOS image sensor uses a bipolar junction transistor instead of a conventional photodiode. By adjusting the width/length ratio of a load transistor (that is, the first MOS transistor) of the sensing device within the current-amplifying logarithmic mode CMOS image sensor, image contrast is improved and output voltage range is increased.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate the embodiments of the invention and, together with the description, serve to explain the principles of the invention. In the drawings.

FIG. 5b is a top view of a sensing device used by the current-amplifying logarithmic mode CMOS image sensor according to this invention;

FIG. 5c is a top view of a sensing device having an alternative layout used by the current-amplifying logarithmic mode CMOS image sensor according to this invention;

DESCRIPTION OF THE PREFERRED EMBODIMENTS

Figure 1:
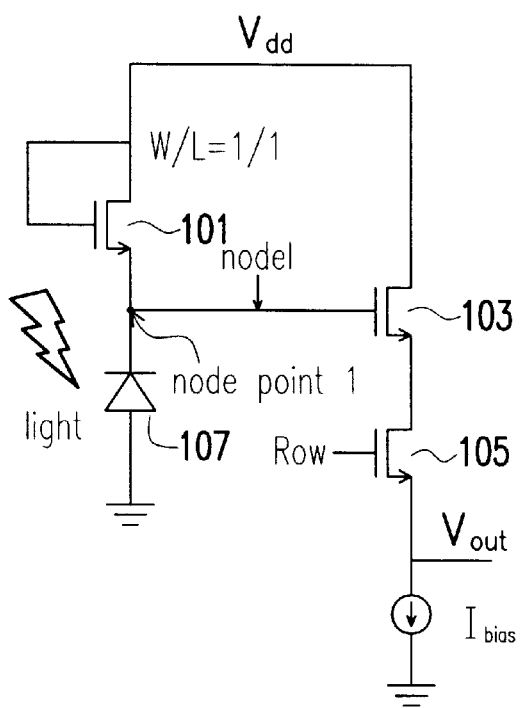
FIG. 1 is a schematic circuit diagram of a conventional logarithmic mode CMOS image sensor.

Reference will now be made in detail to the present preferred embodiments of the invention, examples of which are illustrated in the accompanying drawings. Wherever possible, the same reference numbers are used in the drawings and the description to refer to the same or like parts.

Figure 2:
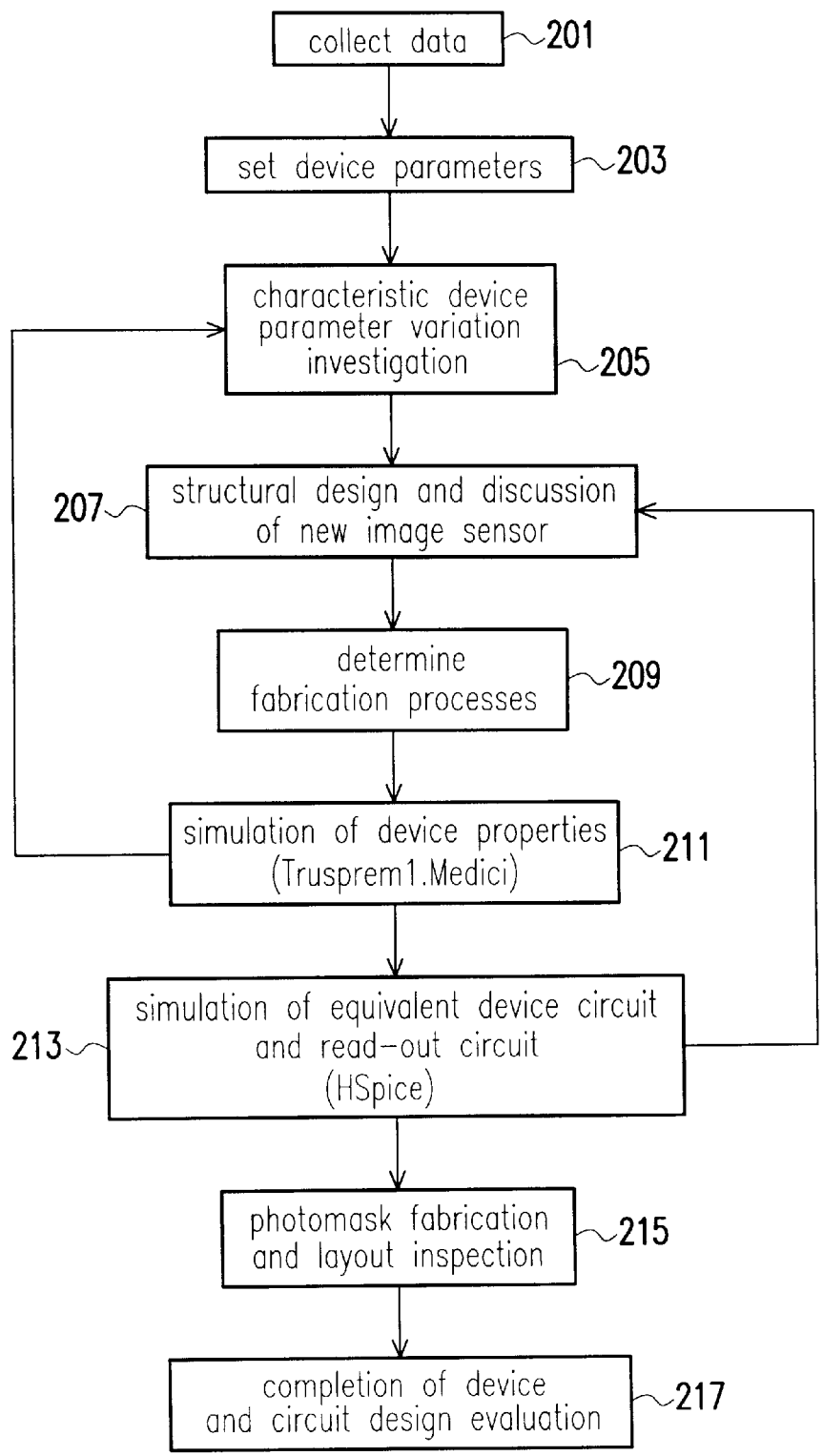
FIG. 2 is a flow chart showing the steps for designing a current-amplifying logarithmic mode CMOS image sensor according to this invention.

FIG. 2 is a flow chart showing the steps for designing a current-amplifying logarithmic mode CMOS image sensor according to this invention. In step 201, information related to the construction of the current-amplifying logarithmic mode CMOS image sensor is collected. In step 203, device parameters for constructing the current-amplifying logarithmic mode CMOS image sensor such as width/length ratio (W/L) are set. In step 205, possible variation of the device parameters is investigated. In step 207, structure of the new image sensor is designed and analyzed. In step 209, steps for fabricating the image sensor are determined. In step 211, device characteristics are investigated through simulation (for example, using software simulators including Trusprem4 or Medici). If device characteristics are found to be inappropriate after the simulation, step 205 is repeated to investigate the reason for parameter variation. In step 213, a simulation (using software simulator such as Hspice) of equivalent circuit and read-out circuit is carried out. If the equivalent circuit and read-out circuit do not function properly, step 207 is repeated to re-design the structure and conduct further analysis. In step 215, photomask are fabricated and layout inspected. Step 217 is the last step indicating the end of the device design and circuit inspection.

According to the foregoing design flow, there are two major aspects in this invention. The first one is the replacement of a conventional photodiode by a bipolar junction transistor inside the logarithmic mode CMOS image sensor. The second one is the adjustment of device parameters of a load transistor inside the CMOS image sensor to obtain a desired output voltage range.

Figure 3:
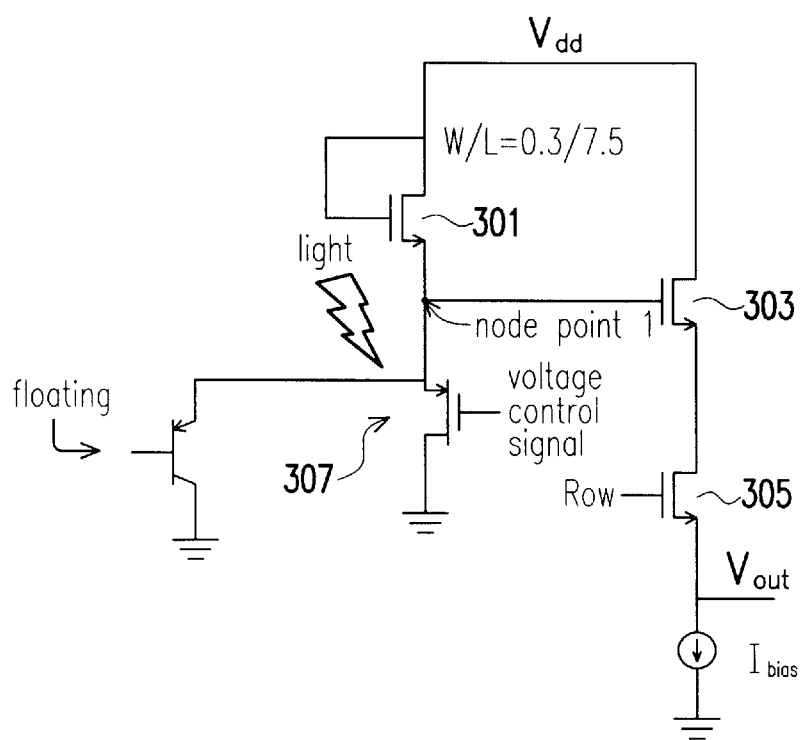
FIG. 3 is a schematic circuit diagram of a current-amplifying logarithmic mode CMOS image sensor according to one preferred embodiment of this invention.

FIG. 3 is a schematic circuit diagram of a current-amplifying logarithmic mode CMOS image sensor according to one preferred embodiment of this invention. As shown in FIG. 3, a current-amplifying logarithmic mode CMOS image sensor comprises of three NMOS transistors 301, 303, 305 and a sensing device 307 (replaces the photodiode 107 in FIG. 1). The gate terminal of the sensing device 307 is tied to a terminal for receiving a voltage control signal. In general, the voltage control signal is the highest voltage $V_{dd}$ applied to the current-amplifying logarithmic mode CMOS image sensor. The voltage control signal controls the conductance of a PMOS transistor inside the sensing device 307 (if the PMOS transistor is conductive, voltage range of the output voltage from the sensing device is reduced).

Figures 4A, 4B:
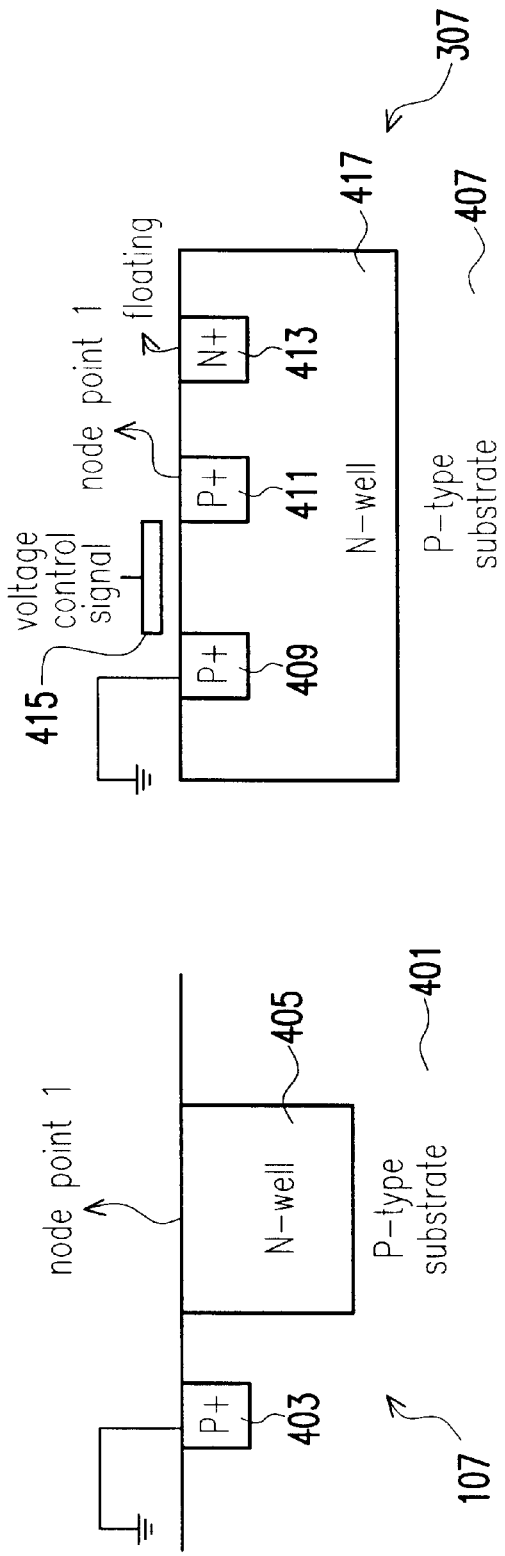
FIG. 4a is a cross-sectional view of a conventional photodiode.
FIG. 4b is a cross-sectional view of a sensing device used by the current-amplifying logarithmic mode CMOS image sensor according to this invention.

FIG. 4a is a cross-sectional view of a conventional photodiode. FIG. 4b is a cross-sectional view of a sensing device used by the current-amplifying logarithmic mode CMOS image sensor according to this invention. As shown in FIGS. 4a and 4b, the photodiode 107 and the sensing device 307 are structurally quite different. In FIG. 4a, the photodiode 107 mainly comprises a P-type injection region 403, an N-well 405 and a P-type substrate. The N-well 405 is tied to node point 1 as shown in FIG. 1. In FIG. 4b, the sensing device 307 mainly comprises P-type injection regions 409, 411, an N-type injection region 413, an N-well 417, a gate 415 and a P-type substrate 407. The gate 415 above the region between the P-type injection region 409 and the P-type injection region 411 is tied to a voltage control signal. Furthermore, the P-type injection region 409 is tied to a ground terminal and the P-type injection region 411 is tied to node point 1 in FIG. 3. The N-type injection region remains in a floating state. Note that node point I is the point of the second terminal of the load transistor (the first transistor) and the gate terminal of a source follower inside the current-amplifying logarithmic mode CMOS image sensor.

Figure 5A:
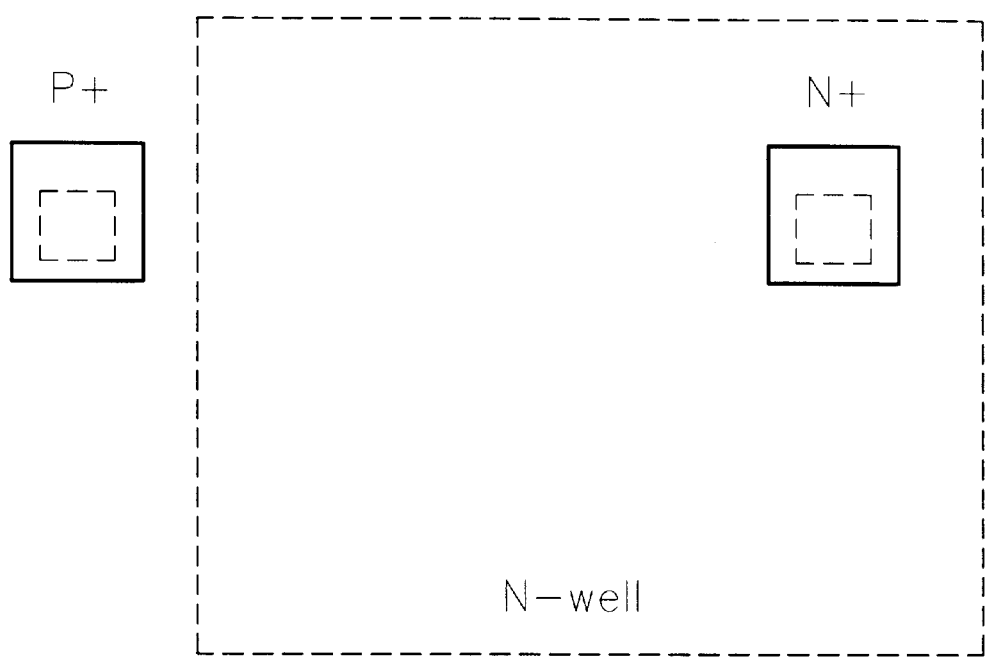
FIG. 5a is a top view of a conventional photodiode.

FIG. 5a is a top view of a conventional photodiode. FIG. 5b is a top view of a sensing device used by the current-amplifying logarithmic mode CMOS image sensor according to this invention. FIG. 5c is a top view of a sensing device having an alternative layout used by the current-amplifying logarithmic mode CMOS image sensor according to this invention.

In this embodiment, the sensing device 307 is manufactured by using a standard 0.25 μm CMOS process. The sensing device 307 is a light sensitive device having a lateral bipolar junction (includes PNP type or NPN type) transistor therein.

According to standard formula, the photodiode 107 in FIG. 4a generates a photo-current between the P-type substrate 401 and the N-well 405. Similarly, the sensing device 307 in FIG. 4b generates a photo-current between the P-type substrate 407 and the N-well 417. The sensing device 307 has a current gain of 25–104 relative to the photodiode 107. Hence, the replacement of a conventional photodiode by a sensing device having a bipolar junction transistor therein improves the current-amplifying aspect of the logarithmic mode CMOS image sensor of this invention to achieve a large output voltage swing.

Figure 6A:
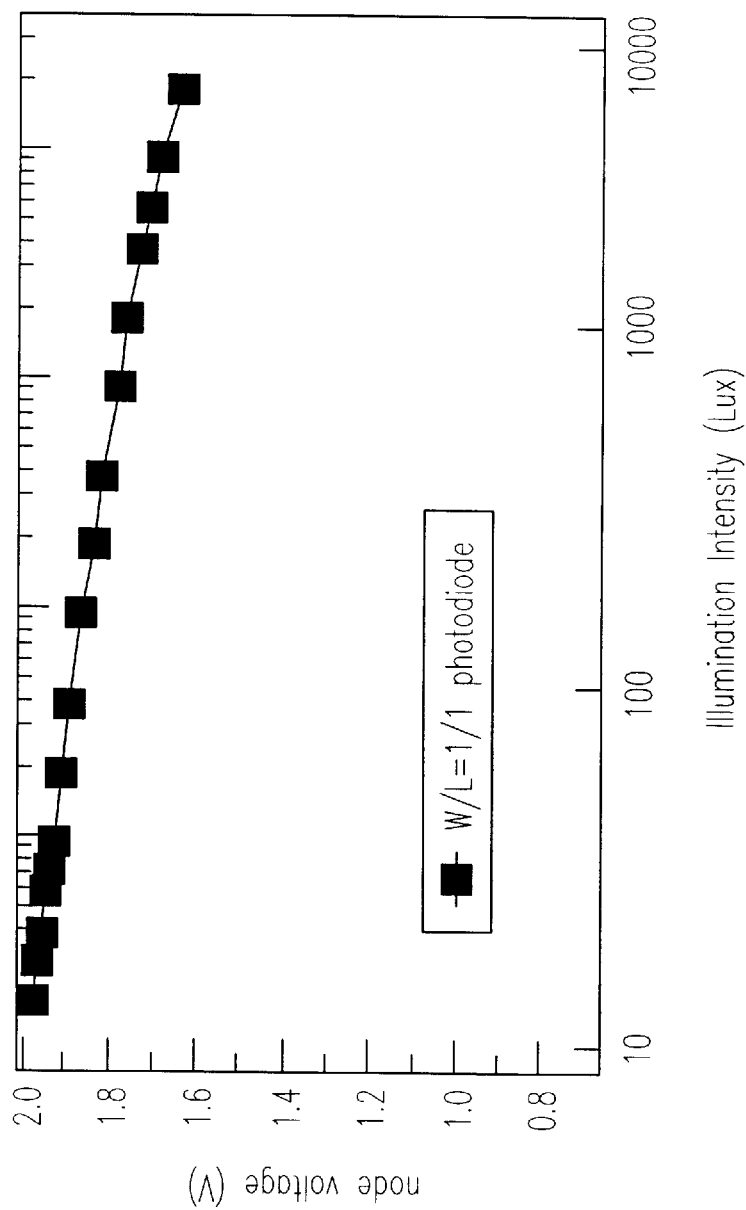
FIG. 6a is a graph showing a voltage (at node point 1) versus illumination intensity for a conventional logarithmic mode CMOS image sensor (shown in FIG. 1) using a load transistor having a width/length ratio of one.
Figure 6B:
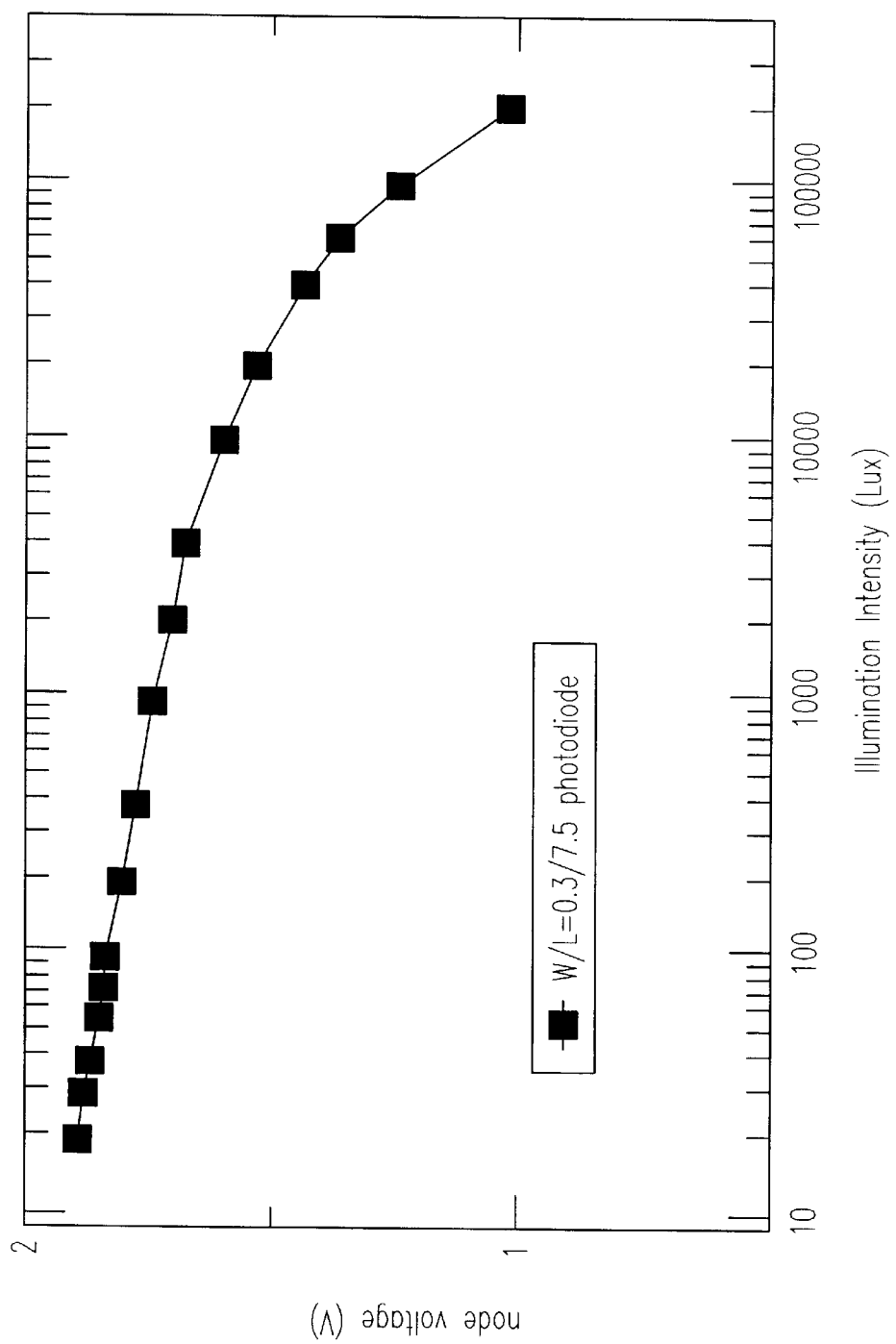
FIG. 6b is a graph showing a voltage (at node point 1) versus illumination intensity relationship for a conventional current-amplifying logarithmic mode CMOS image sensor (shown in FIG. 1) with a load transistor having a width/length ratio of 0.3/7.5.
Figure 6C:
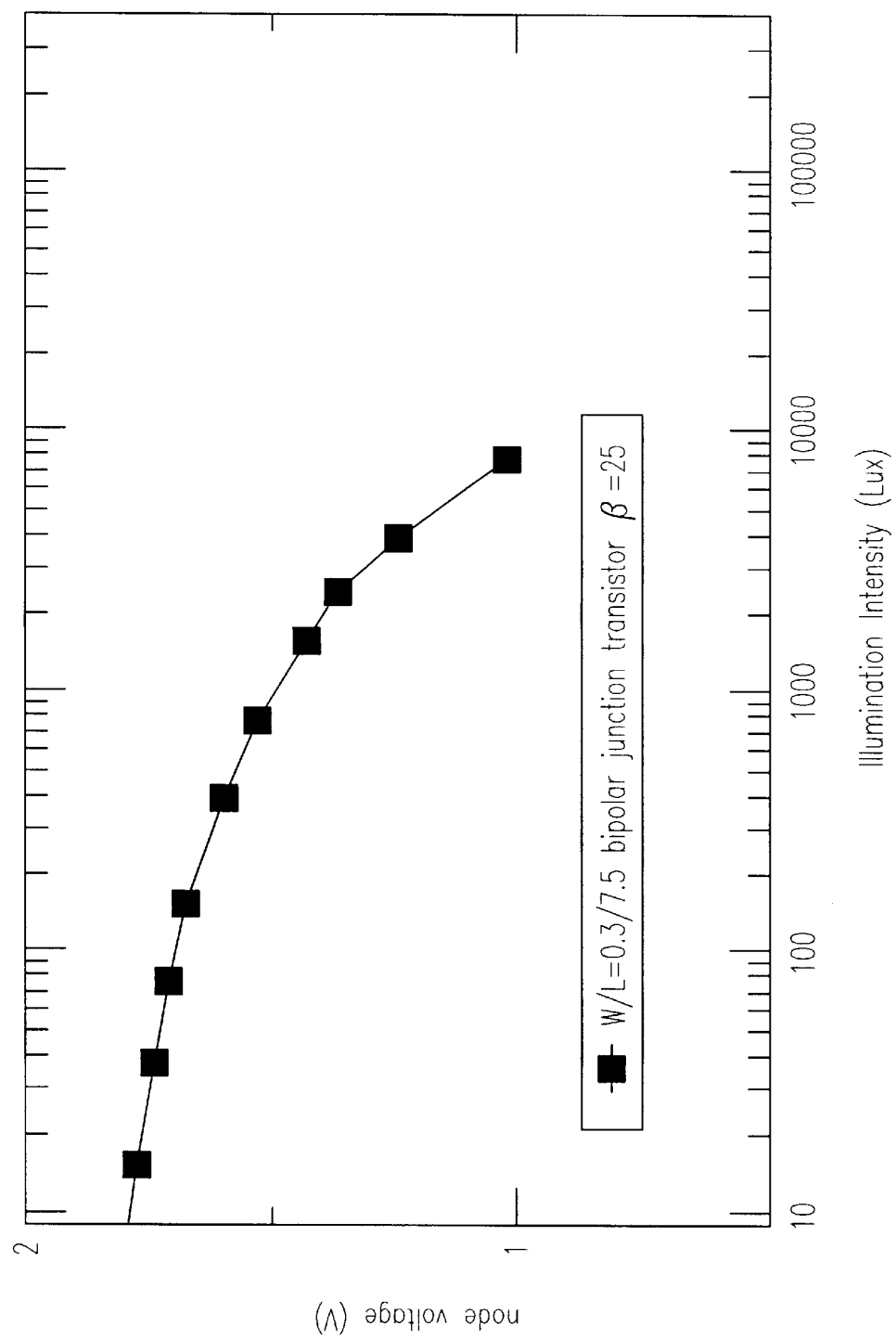
FIG. 6c is a graph showing a voltage (at node point 1) versus illumination intensity relationship for a current-amplifying logarithmic mode CMOS image sensor (shown in FIG. 3) with a bipolar junction transistor and a load transistor having a width/length ratio of 0.3/7.5.

Another major aspect of this invention is the adjustment of load transistor parameters inside the current-amplifying logarithmic mode CMOS image sensor. FIG. 6a is a graph showing voltage (at node point 1) versus illumination intensity (having an illumination intensity range from 0 Lux to 10000 Lux, the normal range of a digital camera) relationship for a conventional current-amplifying logarithmic mode CMOS image sensor (shown in FIG. 1) using a load transistor (NMOS transistor 101) having a width/length ratio of 1/1. FIG. 6b is a graph showing voltage (at node point 1) versus illumination intensity (at normal illumination intensity range of a digital camera) relationship for a conventional current-amplifying logarithmic mode CMOS image sensor (shown in FIG. 1) with a load transistor (NMOS transistor 101) having a width/length ratio of 0.3/7.5. FIG. 6c is a graph showing voltage (at node point 1) versus illumination intensity (at normal illumination intensity range of a digital camera) relationship for a current-amplifying logarithmic mode CMOS image sensor (shown in FIG. 3) with a bipolar junction transistor having a current gain β=25 and a load transistor (NMOS transistor 301) having a width/length ratio of 0.3/7.5.

As shown in FIGS. 6a and 6b, any change in the width/length ratio in the load transistor has some effect on the voltage range of node point 1 that corresponds to the illumination intensity at the photodiode 107. In other words, the output voltage range of the current-amplifying logarithmic mode CMOS image sensor responds to the width/length ratio under the same illumination range. In FIG. 6c, the voltage output at node point 1 has a larger output voltage swing than the ones shown in FIGS. 6a and 6b. When the width/length ratio of the load transistor change by decreasing the width and increasing the length, and the small amount of photo-current transfers from the P-type injection region into the load transistor. Then, the load transistor will shift easily from a sub-threshold region to a saturation region to increase output voltage range of the logarithmic mode CMOS image sensor.

Through experiments, changing width $W_B$ of the polysilicon gate 415 of the sensing device 307 (as shown in FIG. 3) produces different forward gains. The forward gains are listed out in Table 1.

TABLE 1

| $W_B$ | Forward Gain |
|---|---|
| 0.25 μm | 200 |
| 0.35 μm | 102 |
| 0.5 μm | 100 |

Figure 7:
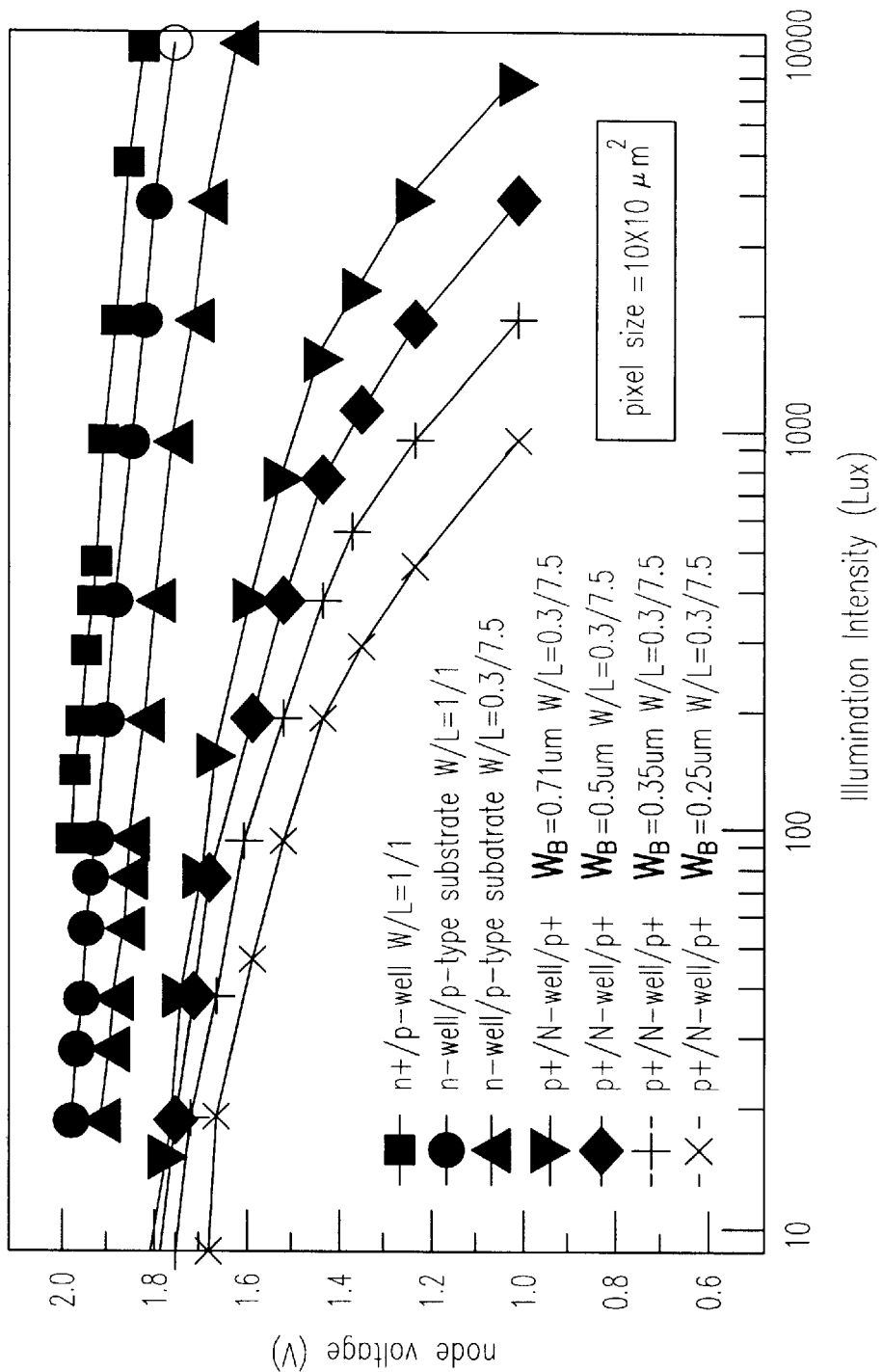
FIG. 7 is a graph showing voltage/illumination intensity relationships between a conventional current-amplifying logarithmic mode CMOS image sensor and the novel design fabricated according to this invention.

FIG. 7 is a graph showing voltage/illumination intensity relationships between a conventional logarithmic mode CMOS image sensor and the new design fabricated according to this invention. When the current-amplifying logarithmic mode CMOS image sensor has a sensing device having a bipolar junction transistor structure and the width/length ratio of the load transistor is properly adjusted, the output voltage range is wide. In other words, the output voltage range of the current-amplifying logarithmic mode CMOS image sensor has a much larger output voltage range than a conventional CMOS image sensor. Furthermore, the new design can demonstrate large image contrast.

In conclusion, the current-amplifying logarithmic mode CMOS image sensor uses a bipolar junction transistor instead of a conventional photodiode. Moreover, the width/length ratio of a load transistor of the sensing device within the current-amplifying logarithmic mode CMOS image sensor is properly adjusted. Hence, image contrast of the CMOS image sensor is improved and corresponding output voltage range is increased under the same illumination range.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A current-amplifying logarithmic mode CMOS image sensor, comprising:

a first MOS transistor having a gate terminal, a first connection terminal and a second connection terminal, wherein the gate terminal and the first connection terminal of the first MOS transistor are tied to a highest voltage terminal Vdd;

a second MOS transistor having a gate terminal, a first connection terminal and a second connection terminal, wherein the gate terminal of the second MOS transistor and the second connection terminal of the first MOS transistor are tied to a node point and the first connection terminal of the second MOS transistor is tied to the highest voltage terminal;

a third MOS transistor having a gate terminal, a first connection terminal and a second connection terminal, wherein the gate terminal of the third MOS transistor is tied to a row select signal terminal, the first connection terminal of the third MOS transistor is tied to the second connection terminal of the second MOS transistor, and the second connection terminal of the third MOS transistor is a voltage output terminal;

a current source Ibias, which is a column amplifier bias current, wherein the Ibias has the first and the second terminal, the first terminal of the current source Ibias is connected to the second terminal of the third MOS transistor, and the second terminal of the current source bias is connected to a grounded terminal; and a sensing device having a parasitic PMOS transistor and a lateral PNP bipolar junction transistor, wherein the PMOS transistor has a gate terminal, a first connection terminal and a second connection terminal, the first connection terminal of the PMOS transistor is tied the node point, the second connection terminal of the PMOS transistor is connected to the grounded terminal, the gate terminal of the PMOS transistor is connected to a voltage control signal terminal, the emitter terminal of the lateral PNP bipolar junction transistor is connected to the node point, the collector terminal of the lateral PNP bipolar junction transistor is connected to the grounded terminal.

2. The CMOS image sensor of claim 1, wherein the width/length ratio of the first MOS transistor is adjusted in such a way that the length is increased and the width is decreased as much as possible.

3. The CMOS image sensor of claim 1, wherein material constituting the gate terminal of the PMOS transistor includes polysilicon.

4. The CMOS image sensor of claim 1, wherein the PMOS transistor can be replaced by an NMOS transistor and the PNP bipolar junction transistor can be replaced by a lateral NPN bipolar junction transistor, the NMOS transistor has a gate terminal, a first connection terminal and a second connection terminal, the first connection terminal of the NMOS transistor is connected to the node point, the second connection terminal of the NMOS transistor is connected to the grounded terminal, the gate terminal of the NMOS transistor is connected to the voltage control signal terminal, the collector terminal of the lateral NPN bipolar junction transistor is connected to the node point, the emitter terminal of the lateral NPN bipolar junction transistor is connected to the grounded terminal and the base terminal of the lateral NPN bipolar junction transistor is in a floating state.

* * * * *